(12) United States Patent
Castleberry et al.

(10) Patent No.: US 11,812,574 B2
(45) Date of Patent: Nov. 7, 2023

(54) PROTECTIVE SKIRT FOR TELECOMMUNICATIONS CABLES

(71) Applicant: CORNING RESEARCH & DEVELOPMENT CORPORATION, Corning, NY (US)

(72) Inventors: Nathan Grant Castleberry, Keller, TX (US); Diana Rodriguez, Fort Worth, TX (US); Mitchell Harold Stewart, Lincolnton, NC (US)

(73) Assignee: Corning Research & Development Corporation, Corning, NY (US)

( * ) Notice: Subject to any disclaimer, the term of this patent is extended or adjusted under 35 U.S.C. 154(b) by 23 days.

(21) Appl. No.: 17/351,339

(22) Filed: Jun. 18, 2021

(65) Prior Publication Data

US 2021/0410310 A1 Dec. 30, 2021

Related U.S. Application Data

(60) Provisional application No. 63/045,391, filed on Jun. 29, 2020.

(51) Int. Cl.
*H02G 3/14* (2006.01)
*H05K 5/03* (2006.01)

(52) U.S. Cl.
CPC ................. *H05K 5/03* (2013.01); *H02G 3/14* (2013.01)

(58) Field of Classification Search
CPC .......... H02G 3/0431; H02G 3/00; H02G 3/02; H02G 3/04; H02G 3/0406; H02G 3/0418;
(Continued)

(56) References Cited

U.S. PATENT DOCUMENTS 4,864,467 A * 9/1989 Byrd ..................... H02B 1/50
174/45 R
6,284,975 B1 * 9/2001 McCord .............. G02B 6/4459
174/71 R
(Continued)

FOREIGN PATENT DOCUMENTS

GB  2370698 A  7/2002
GB  2475043 A  5/2011
(Continued)

OTHER PUBLICATIONS

European Patent Application No. 21182556.7, Extended European Search Report, dated Nov. 23, 2021; 8 pages; European Patent Office.

*Primary Examiner* — Angel R Estrada (57) ABSTRACT

A protective apparatus for telecommunications cables is provided including a mounting frame configured to be affixed to a wall and a protective skirt configured to be selectively engaged with the mounting frame to define an internal volume configured for routing of the telecommunications cables. The mounting frame or the protective skirt including a U-channel dispose at an edge and the other of the protective skirt and the mounting frame including a flange configured to be received in the U-channel. The protective skirt is engaged with the mounting frame when the flange is inserted into the U-channel and the protective skirt is disengaged from the mounting frame by flexion of the protective skirt causing the flange to withdraw from the U-channel.

22 Claims, 6 Drawing Sheets

(58) Field of Classification Search
CPC .. H02G 3/0425; H02G 3/0437; H05K 5/0247; H05K 5/03; H05K 5/0217; F16L 3/12; F16L 3/16
USPC .......... 174/480, 481, 50, 53, 57, 68.1, 68.3, 174/72 C; 220/3.2, 3.8, 3.5; 385/134, 385/135; 439/207, 209, 210–213; 52/220.5, 220.7, 220.8, 249
See application file for complete search history.

(56) References Cited

U.S. PATENT DOCUMENTS

| | | | | |
|---|---|---|---|---|
| 6,323,421 B1 * | 11/2001 | Pawson | ................ | H02G 3/0608 174/68.1 |
| 6,972,367 B2 * | 12/2005 | Federspiel | ........... | H02G 3/0437 174/68.3 |
| 7,385,148 B2 * | 6/2008 | Picard | ................ | H02G 3/0431 174/68.3 |
| 7,417,188 B2 * | 8/2008 | McNutt | ................ | H02G 3/045 174/101 |
| 7,645,935 B1 * | 1/2010 | Picard, Jr. | ................ | H02G 3/14 174/64 |
| 7,741,568 B2 * | 6/2010 | Makwinski | .......... | H02G 3/0431 174/68.3 |
| 8,420,942 B2 * | 4/2013 | Short | ................ | H02G 3/0456 174/95 |
| 8,779,290 B1 * | 7/2014 | DePaul | ................ | H02G 3/0431 174/68.3 |
| 10,559,947 B2 | 2/2020 | Frye et al. | | |
| 2003/0089515 A1 | 5/2003 | Federspiel et al. | | |
| 2008/0041623 A1 | 2/2008 | Makwinski et al. | | |

FOREIGN PATENT DOCUMENTS

| | | |
|---|---|---|
| GB | 2509942 A | 7/2014 |
| GB | 2510362 A | 8/2014 |

* cited by examiner

PROTECTIVE SKIRT FOR TELECOMMUNICATIONS CABLES

PRIORITY APPLICATION

This application claims the benefit of priority of U.S. Provisional Application No. 63/045,391, filed on Jun. 29, 2020, the content of which is relied upon and incorporated herein by reference in its entirety.

BACKGROUND

Field

The present invention relates generally to protective elements for telecommunications cables, and more particularly to a protective skirt and related hardware for protecting telecommunications cables as they enter or exit a telecommunications terminal.

Technical Background

Telecommunications terminals in a telecommunications network may be referred to as local convergence points (LCP), fiber distribution terminals (FDT), fiber distribution hubs (FDH), and the like. Such telecommunications terminals are typically cabinets or enclosures which house fiber or electrical junctions, such as, for example, fiber connection points, splices, splitters, optical-to-electrical converters or other components. The telecommunications terminal provides a convergence point that offers management capabilities to the network operator or service provider.

Telecommunications cables often transfer data from a central office to dispersed homes, apartments, office buildings, or other locations via telecommunications terminal. The cables are often routed through underground conduits or aboveground on elevated telephone poles. At the point where the cable approaches a home, apartment, office building or other location for final deployment, there is often a need to expose the cable from the underground conduit or elevated telephone pole to connect the cable to a telecommunications enclosure for splicing, optical\electrical conversion, splitting, or other coupling to local feeder cables or drop cables. The cable is protected in the underground conduit or above-ground telephone pole and when the cable is within the enclosure, but the cable may be unprotected directly outside of the enclosure. In some deployments a protective skirt is provided to route the telecommunications cables from the underground conduit to the telecommunications enclosure or assembly. The protective skirt is often attached using one or more screws or similar fasteners. These fasteners may increase the time necessary for service, installation, or repair of the telecommunication terminal and/or telecommunication cables. In many cases, it may be cumbersome for a worker to hold the protective skirt in place and install the fasteners. In addition, the fasteners and/or receiving apertures may wear over consecutive uses causing stripping of the fasteners and/or the receiving apertures, which may require repair or replacement of the fasteners, protective skirt and/or the mounting frame.

SUMMARY OF THE DETAILED DESCRIPTION

Embodiments disclosed herein include a protective apparatus for telecommunication cables. The protective apparatus may include a mounting frame and a protective skirt configured to cover and protect one or more telecommunications cables routed in the internal volume defined by the mounting frame and the protective skirt. The mounting frame and protective skit may include a flange and U-channel configuration enabling toolless installation and removal of the protective skirt from the mounting frame.

In an example embodiment, the mounting frame may include a U channel of either side of the frame. The protective skirt may include a flange disposed on either side of the protective skirt. The protective skirt may be formed from a flexible material enabling the protective skirt to flex inward to allow the flange to pass the edge of the mounting from U-channel and then expand, such that the flange engages the U channel.

Additional features and advantages will be set forth in the detailed description which follows, and in part will be apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding, and are incorporated in and constitute a part of this specification. The drawings are illustrative of selected aspects of the present description, and together with the specification explain principles and operation of methods, products, and compositions embraced by the present description. Features shown in the drawing are illustrative of selected embodiments of the present description and are not necessarily depicted in proper scale.

BRIEF DESCRIPTION OF THE FIGURES

While the specification concludes with claims particularly pointing out and distinctly claiming the subject matter of the written description, it is believed that the specification will be better understood from the following written description when taken in conjunction with the accompanying drawings, wherein:

The embodiments set forth in the drawings are illustrative in nature and not intended to be limiting of the scope of the detailed description or claims. Whenever possible, the same reference numeral will be used throughout the drawings to refer to the same or like features. The drawings are not necessarily to scale for ease of illustration an explanation.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Embodiments disclosed in the detailed description include a protective apparatus for telecommunication cables that enter or exit a telecommunications terminal. A telecommunications terminal may also be referred to as a local convergence point (LCP), a fiber distribution hub (FDH), a fiber distribution terminal (FDT), single dwelling unit (SDU), multiple dwelling unit (MDU), or the like. The telecommunications terminal may include a shell or other enclosure that defines an internal volume and at least one cable entry port. The cable entry port may be configured to receive at least one feeder cable and one or more distribution cable. The telecommunication terminal may enclose one or more electrical or fiber optic communication connections, such as between the feeder cable and one or more distribution cables. To protect the portions of the feeder cable and the distribution cable that are external to the telecommunications terminal, the protective apparatus includes a mounting frame and a protective skirt that encloses the exposed portions of the feeder and distribution cables.

The mounting frame is configured to be fixed to an exterior wall, façade, or surface of a home, building, or other structure. The protective skirt is removably attachable to the mounting frame to protect the portions of the feeder cable and distribution cable within the internal volume of the protective apparatus. The mounting frame and sidewalls are configured to allow for toolless installation and removal of the protective skirt without the need to remove or engage fasteners therebetween. As such, the protective apparatus provides for a more rapid deployment of feeder and distribution cables as well as faster maintenance and/or repair, should subsequent access be required.

Figure 1:
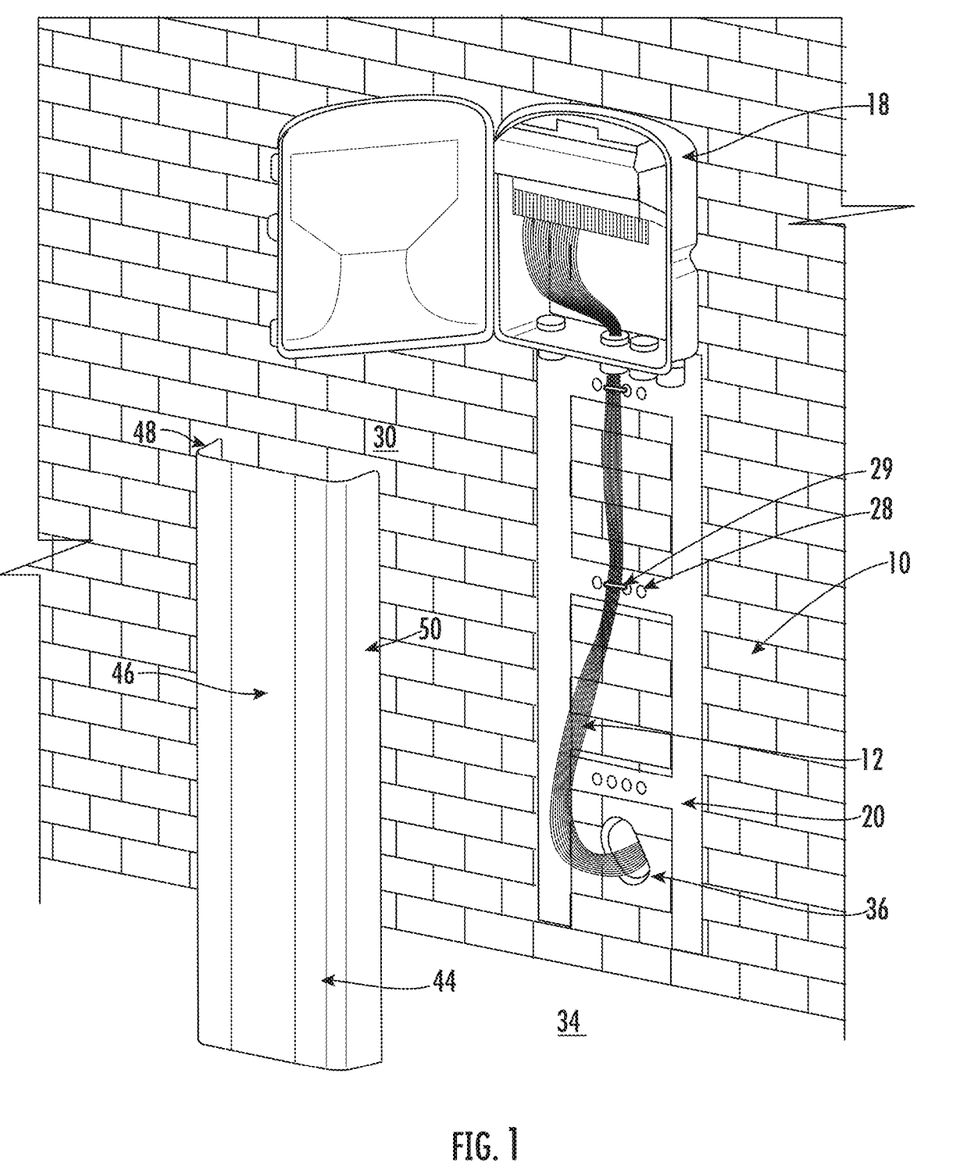
FIG. 1 is a front, perspective view of an exemplary embodiment of a protective apparatus for telecommunications cables positioned below an example telecommunications terminal as deployed on a wall with a protective skirt removed according to an example embodiment.

In this regard, FIG. 1 illustrates a protective apparatus 10 for telecommunication cables 12 according to one embodiment of the disclosure. The protective apparatus 10 provides protection for and convenient access to the telecommunication cables 12, including feeder cables and distribution cables of a telecommunications terminal 18. The protective apparatus 10 protects the feeder and distribution cables from accidental or intentional damage.

The protective apparatus 10 includes a mounting frame 20 that is securable to a wall, such as an exterior surface or facade 30 of the building, home or other structure and and a protective skirt 44 that is removably coupleable to the mounting frame 20. The mounting frame 20 and protective skirt 44 may define an internal volume 32 (FIG. 5C) configured for routing of the telecommunication cable 12. The protective apparatus 10 is positionable adjacent to a telecommunications terminal 18 to protect the exposed portions of the feeder and distribution cables that enter and exit the telecommunications terminal 18.

In an example embodiment, the protective apparatus 10 may be positioned between a telecommunications terminal 18 and a ground surface 34. For example, the telecommunications terminal 18 may be installed in an aerial installation on a building façade 30 with the protective apparatus 10 installed on the building façade 30 below the telecommunications terminal 18. The protective apparatus 10 may be positioned between a ground surface 34 and the telecommunications terminal 18 to substantially protect the area between the ground surface 34 and the telecommunications terminal 18 and the telecommunication cables 12 contained therein. Similarly, the telecommunication cables 12 may penetrate the building façade 30 at or near the ground surface 34, such as through a cable hole 36. The protective apparatus 10 may be positioned between a telecommunications terminal 18 and a ground surface 34, or terminate above the ground surface 34 after covering the cable hole 36. As such, the protective skirt 44 may also provide some environmental protection to the cable hole 36.

In various types of telecommunications installations, the feeder and distribution cables may be aerial cables, subterranean cables, the cables may be secured to the exterior façade 30 of the building, or a combination of the foregoing. As such, the protective apparatus 10 accommodates various cable positions. For example, the telecommunication cables 12 in FIG. 1 are subterranean cables that extend from cable hole 36 near the ground surface 34 vertically into the telecommunications terminal 18. In some embodiments the subterranean cables my exit the ground outside of the building directly from the ground surface 34. The subterranean cables are protected when underground and the protective skirt 44 protects these cables from damage as the cables extend from the ground surface 34, or cable hole 36, to the telecommunications terminal 18.

In other embodiments, the telecommunications cables 12 may be aerial cables that are secured to the facade 30 of the building before entering the telecommunications terminal 18. An opening at the end of the protective skirt 44 and/or a sidewall aperture in protective skirt 44 (not shown) may allow for the telecommunications cables 12 to enter the internal volume 32 (FIG. 5C) defined by the mounting frame 20 and the protective skirt 44. In an example embodiment, an opening in the side wall may be molded or cut in the protective skirt 44.

Referring still to FIG. 1, the height of the mounting frame 20 and/or the protective skirt 44 may be sized to correspond to the distance between the telecommunications terminal 18 and the ground surface 34. In addition, the width of the mounting frame 20 and the protective skirt 44 may be sized to correspond to the width of the telecommunications terminal 18. The telecommunications terminal 18 may thereby close, or fill, an opening in the end of the protective skirt 44.

Figure 2:
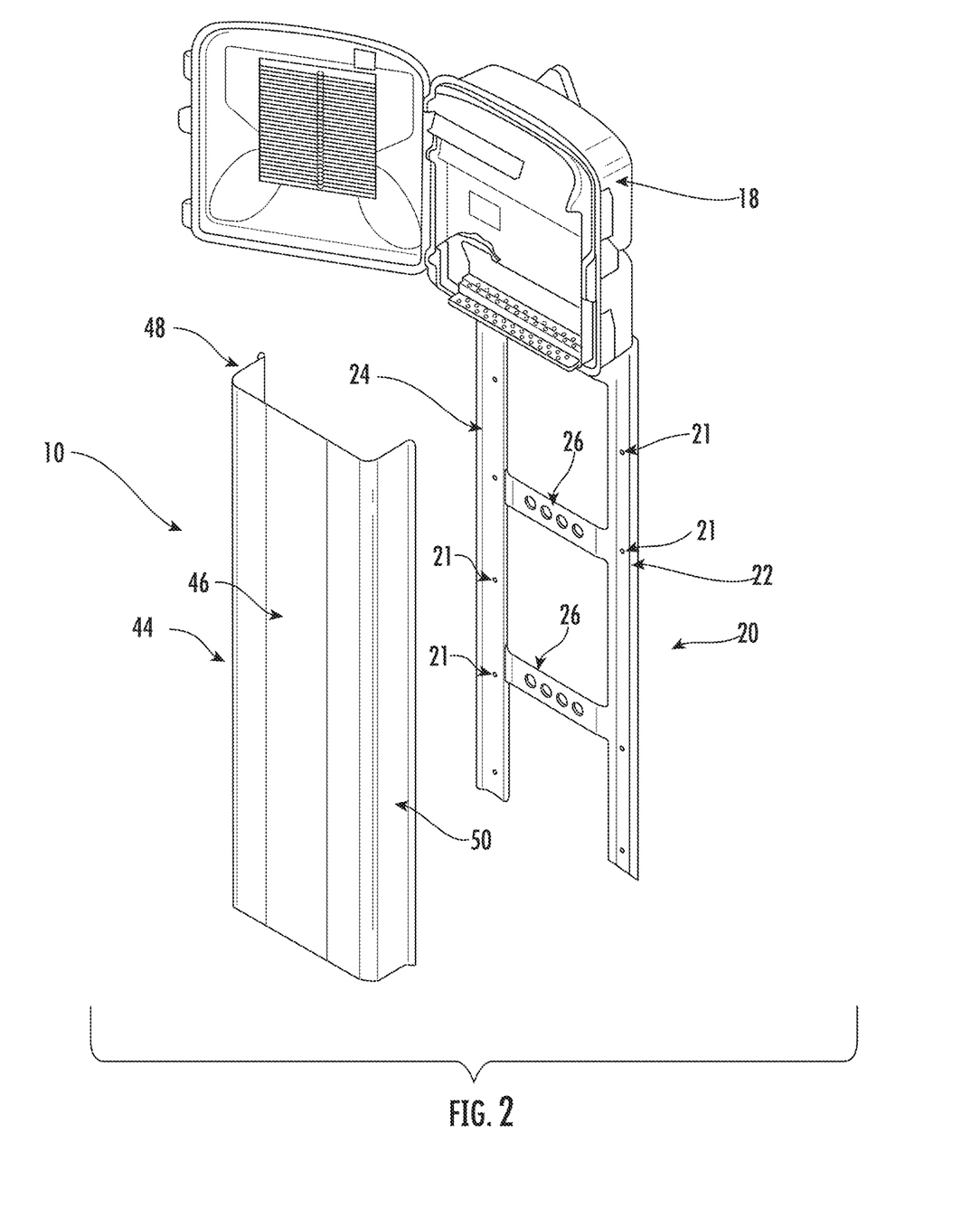
FIG. 2 is an additional perspective view of the protective apparatus of FIG. 1 according to an example embodiment.
Figure 3:
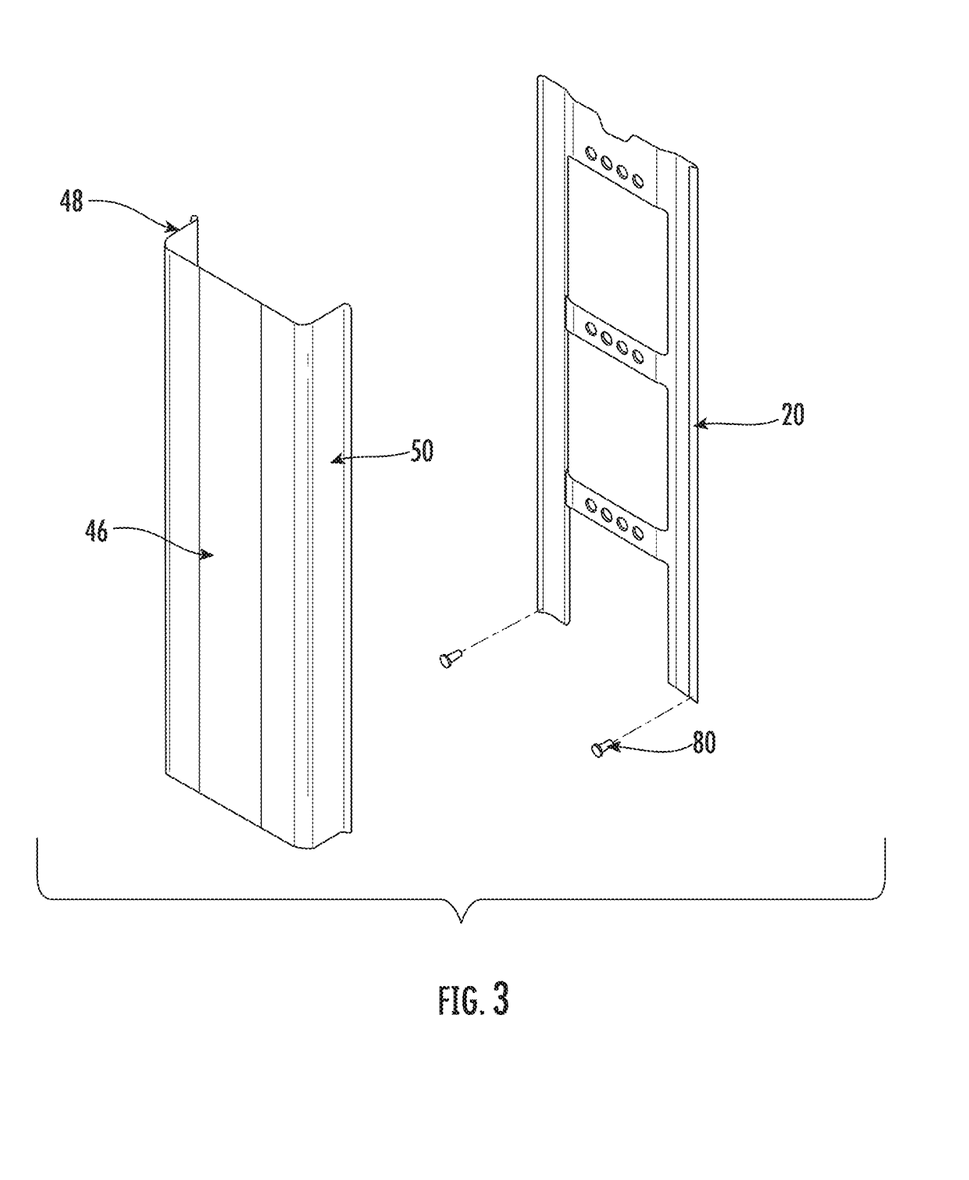
FIG. 3 is an exploded perspective view of an exemplary embodiment of a protective apparatus for telecommunications cables according to an example embodiment.
Figure 4:
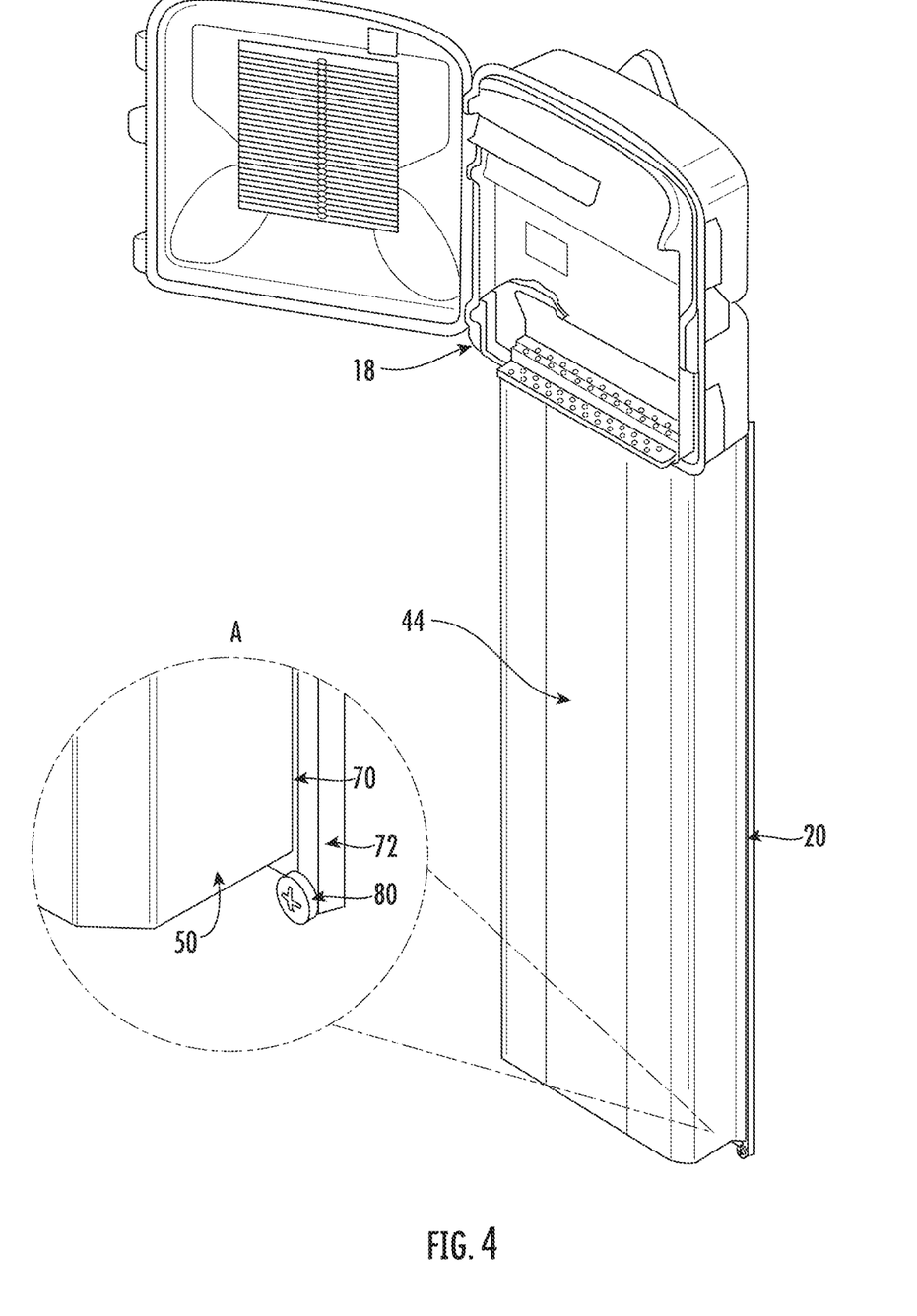
FIG. 4 is a perspective view of an exemplary embodiment of a protective apparatus with protective skirt installed and including a travel stop according to an example embodiment.

FIG. 2 illustrates an embodiment of a protective apparatus 10 with the protective skirt 44 removed and building details deleted for clarity. The mounting frame 20 may include a first vertical member 22, a second vertical member 24, and one or more transverse members 26. The first vertical member 22, the second vertical member 24, the one or more transverse members 26 may be arranged in a rectangular formation.

The first vertical member 22, the second vertical member 24, and one or more transverse members 26 are coupleable to an external façade 30 or wall of a building, house, or other structure. For example, in some embodiments, the first vertical member 22, the second vertical member 24, and one or more transverse members 26 are coupled to an external facade 30 of the building by fasteners, such as screws, that pass through mounting features, such as openings 21, in any or all of the first vertical member 22, the second vertical member 24, and one or more transverse members 26. Other attachment mechanisms for securing the mounting frame 20 to an external surface or facade 30 of a building include, without limitation, adhesive, nails, hooks, or the like.

In addition, the first vertical member 22, the second vertical member 24, and one or more transverse members 26 may each include weatherproofing features to seal the protective skirt 44 to the mounting frame 20. For example, one or more of the first vertical member 22, the second vertical member 24, may include one or more grommets to seal the first vertical member 22, the second vertical member 24, and one or more transverse members 26 to the protective skirt 44 when the protective skirt 44 is attached to the mounting frame 20.

Although the mounting frame 20 is illustrated in a rectangular format in the figures associated herewith, the mounting frame 20 and protective skirt 44 may have any suitable size and shape suitable to protect the telecommunication cables 12.

In some example embodiments, the transverse members 26 may include one of more cable retention features 28, such as apertures or projections, configured to restrain the telecommunication cable 12 in a desired position in the internal volume 32. For example, a craftsman may secure a telecommunication cable 12 in the desired position by tying a cable tie though an aperture and around the telecommunication cable 12.

The first vertical member 22 and the second vertical member 24 may each include attachment mechanisms to facilitate coupling of the protective skirt 44 to the mounting frame 20, as described in more detail below.

The protective skirt 44, as depicted in FIGS. 1-5C, includes a main body portion 46 and two side portions 48, 50 that together define a U-shaped cross-section having an opening at either end. In embodiments in which the telecommunication cable 12 does not enter the internal volume 32 from the ground surface 34, the bottom opening of the protective skirt 44 may be closed, or have a cover installed thereon. The main body portion 46 may be planar or maybe curved depending on the area to the enclosed by the protective skirt 44 and the aesthetic requirements of the protective skirt 44. Likewise, the two side portions 48, 50 may be planar or curved.

As discussed above, the overall height of the protective skirt 44 may correspond to the distance between the telecommunications terminal 18 and the ground surface 34 (FIG. 1). Likewise, the height of the main body portion 46 of the protective skirt 44 may correspond to the distance between the telecommunications terminal 18 and the ground surface 34. Similarly, the width of the main body portion 46 may correspond to the width of the telecommunications terminal 18.

While the protective skirt 44 has a U-shaped cross section and a generally rectangular shape in the depicted embodiments, the protective skirt 44 may have any suitable shape and size. For example, in some embodiments the protective skirt 44 may flare outwardly at one or more locations to protect specific portions of a telecommunications cable 12 or to accommodate particular surfaces in a building façade 30.

The intersection between the main body portion 46 and the side portions 48, 50 may include a fillet, bend, chamfer, or other feature to improve the structural strength of the protective skirt 44 and to accommodate aesthetic requirements of the protective skirt 44.

The first side portion 48 and a second side portion 50 extend away from the main body portion 46. The first and second side portions 48, 50 include fastening features for removably coupling the protective skirt 44 to corresponding fastening features of the mounting frame 20. For example, in the embodiment illustrated in FIGS. 5A-C, the protective skirt 44 includes a flange 70 extending outward from at least a portion of an outer edge of the protective skirt 44 and the mounting frame 20 includes a corresponding U-Channel 72. Although the depicted embodiment includes the flange 70 associated with the protective skirt 44 and the U-channel 72 associated with the mounting frame 20, the flange 70 may be associated with the mounting frame 20 and the U-channel 72 may be associated with the protective skirt 44. Additionally, combinations of these embodiments are also contemplated.

In an example embodiment, the flange 70 may extend generally perpendicularly from the side portions 48, 50. The opening of U-channel 72 may be disposed at the edges of the vertical members 22 and 24 facing inward toward the transverse members 26. The U-channel 72 may be a separate component that is attached to the mounting frame 20 or, alternatively, may be an integral portion of the mounting frame 20. For example, the U-channel may be formed by bending the vertical members 22 and 24 at the edges in toward the transverse members 26.

Figure 5A:
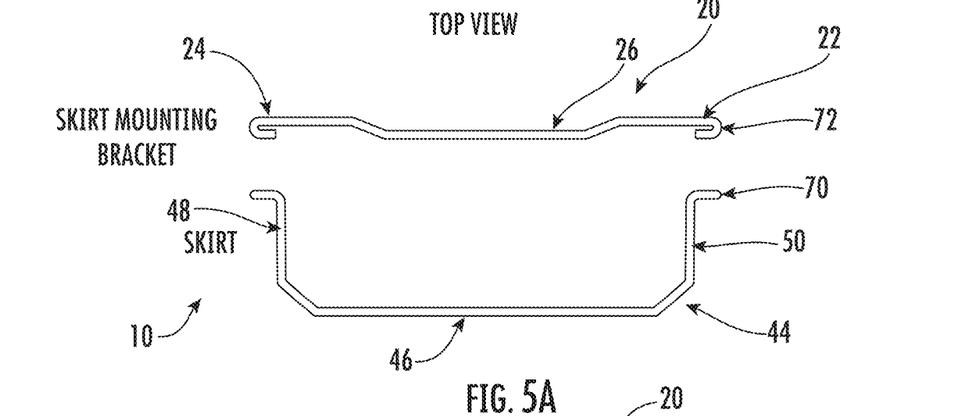
FIGS. 5A-5C are a top down view of the installation of a protective skirt on a mounting frame according to an example embodiment.
Figure 5B:
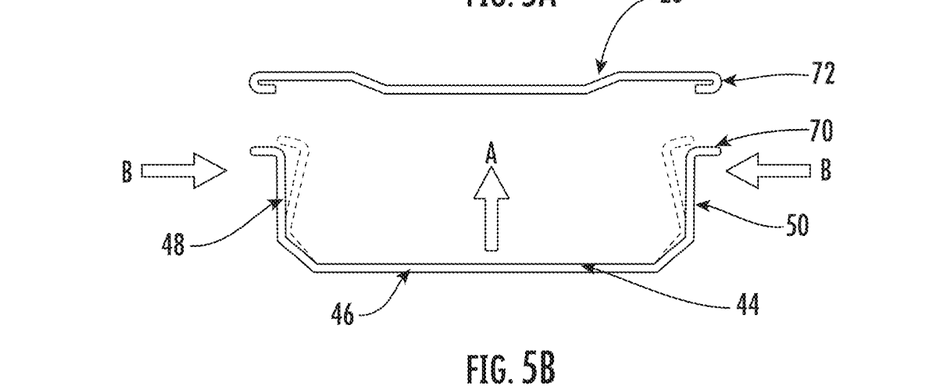
Figure 5C:
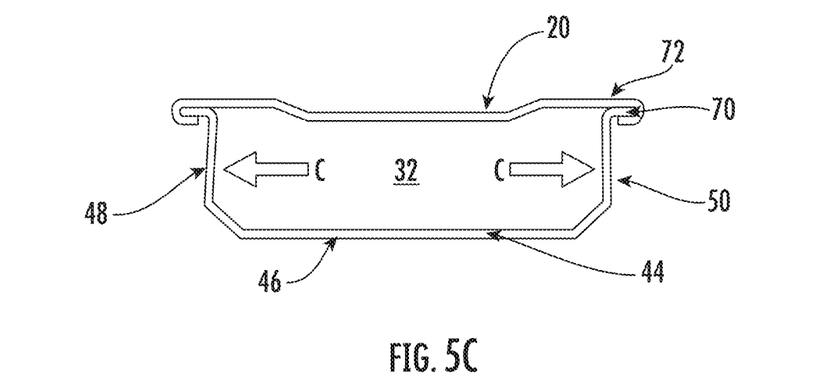

A method of protecting one or more telecommunication cables, is depicted in FIGS. 5A-5C. The mounting frame 20 may be affixed to an external surface or facade 30 of a building, such as by fasteners or adhesive. As shown in FIG. 1, a telecommunication cable 12 may be routed over the mounting frame 20. As depicted in FIG. 5B, the protective skirt 44 may be flexed to move the flange 70 inward, enabling the flange 70 to pass edged of the U-channel 72 as the protective skirt 44 is moved toward the mounting frame 20, as depicted by arrow A. The flexion of the protective skirt 44 may be flexion of the side portions 48, 50 inward, as depicted by arrow B. Additionally or alternatively, the main body portion 46 may flex to enable the flange 70 to pass the edges of the U-channel 72. The flange 70 may be inserted into the U-channel 72 by releasing the flexion force applied to the protective skirt 44, such that the side portions 48, 50 move toward the U-channel 72, as depicted by arrow C in FIG. 5C. The protective skirt 44 may be formed from fiber glass, sheet metals, such as steel and aluminum, plastics, such as polyvinyl chloride (PVC), or other suitable material having sufficient rigidity to protect the telecommunications cables 12 and sufficient flexibility to enable repeated flexion.

To remove the protective skirt 44, the process may be reversed. For example, a craftsman may cause flexion of the protective skirt 44 causing the flange 70 to withdraw from the U-channel 72 and then move the protective skirt 44 away from the mounting frame 20 to disengage the protective skirt 44 from the mounting frame 20. The installation and removal of the protective skirt 44 from the mounting bracket 20 may be accomplished without tools or fasteners, thereby reducing installation and repair time and complexity. Further, there is no damage or wear of the protective skirt 44 external surface or facade 30 of a building due to repeated installation and removal of fasteners.

Figure 6:
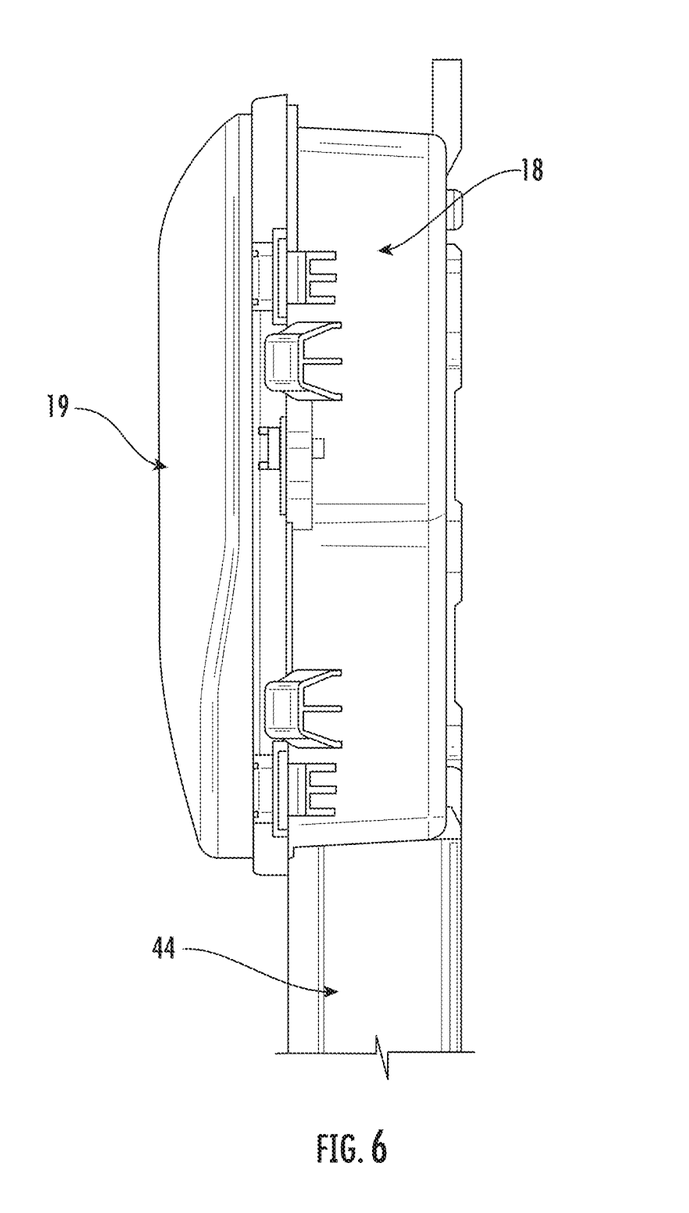
FIG. 6 illustrates a side view of a telecommunication terminal and protective apparatus according to an example embodiment.

In some example embodiments, a lid or cover 19 of the telecommunications terminal 18 may limit or prevent removal of the protective skirt 44, when the cover is in a shut position. As depicted in FIG. 6, the cover 19 may extend beyond a bottom edge of the telecommunications terminal 18. The portion extending beyond the bottom edge may cover a portion of the protective skirt 44, thereby restricting or limiting the removal of the protective skirt 44 from the mounting frame 20. In such an embodiment, the additional step of opening the cover 19 of the telecommunications terminal 18 may be performed prior to removal of the protective skirt 44.

In the embodiment depicted in FIG. 5B, the flange 70 of the protective skirt 44 may be wider than the distance between the U-channels 72 of the vertical members 22 and 24. The difference between the width of the flange 70 and the U-channel 72 may cause the flange 70 to be biased toward the U-channel 72. As depicted in FIG. 5C, the side portions 48,50 remain in an at least partially flexed state when fully inserted in to the U-channel 72. The maintained partial flexion of the protective skirt 44 when the flange 70 is inserted into the U-channels 72 may assist in retention of the protective skirt 44 in engagement with the mounting frame 20.

Referring back to FIGS. 3 and 4, the mounting frame 20 may include a travel stop 80 disposed at an end of the mounting frame 20. The travel stop 80 may be configured to resist vertical movement of the protective skirt 44 or flange 70, thereby maintaining the protective skirt 44 in engagement with the mounting frame 20. In an example embodiment, the travel stop 80 may be configured to limit movement of the flange 70 along the U-channel 72, when the flange 70 is inserted in the U-channel 72. The travel stop 80 may be a molded portion of the mounting frame 20, such as a closed end of the U-channel 72. In some examples, the closed end may be formed by metal or plastic welding, kinking, or folding of an end portion of the U-channel 72. In additional embodiments, such as depicted in detail A of FIG. 4, the travel stop 80 may be a fastener or other element inserted through the U-channel 72 or into the mounting frame 20 adjacent to the U-channel 72 below the protective skirt 44.

The protective apparatus as described herein enables ingress and egress for feeder and distribution cables routed to a telecommunications terminal. Further, the flange and U-channel arrangement enables the protective skirt to be installed and removed toollessly and without fasteners. This may reduce installation and maintenance times of the telecommunication terminal, as well as extend the life of the protective elements associated therewith.

In an example embodiment, a protective apparatus for telecommunications cables is provided including a mounting frame configured to be affixed to a wall and a protective skirt configured to be selectively engaged with the mounting frame to define an internal volume configured for routing of the telecommunications cables. The mounting frame or the protective skirt includes a U-channel dispose at an edge and the other of the protective skirt and the mounting frame includes a flange configured to be received in the U-channel. The protective skirt is engaged with the mounting frame when the flange is inserted into the U-channel and the protective skirt is disengaged from the mounting frame by flexion of the protective skirt causing the flange to withdraw from the U-channel.

In some example embodiment, the U-channel includes a first U-channel disposed at a first edge of the mounting frame and a second U-channel disposed at a second edge of the mounting frame. In an example embodiment, the flange defines at least a portion of the outer edge of the protective skirt. In some example embodiment, the mounting frame further includes a travel stop configured to limit movement of the flange along the U-channel, when the flange is inserted in the U-channel. In an example embodiment, the travel stop is disposed at an end of the mounting frame. In some example embodiment, the protective skirt is configured to bias the flange toward the U-channel. In an example embodiment, the mounting frame includes at least one cable retention feature. In some example embodiment, the protective skirt is open at least one end. In an example embodiment, the protective skirt comprises a first opening at a first end and a second opening at a second end. In some example embodiment, the mounting frame includes a plurality of mounting features configured to affixed the mounting frame to the wall. In an example embodiment, the protective skirt is toolessly removable from the mounting frame. In some example embodiment, the U-channel includes a first U-channel disposed at a first edge of the protective skirt and a second U-channel disposed at a second edge of the protective skirt. In an example embodiment, the flange defines at least a portion of the outer edge of the mounting frame.

In a further example embodiment, a method of protecting telecommunications cables is provided including affixing a mounting frame to a wall, providing a protective skirt. The mounting frame or the protective skirt includes a U-channel dispose at an edge and the other of the protective skirt and the mounting frame includes a flange configured to be received in the U-channel. The method also includes flexing protective skirt to enable the flange to align with the U-channel and inserting the flange into the U-channel.

In some example embodiment, the method also includes flexing the protective skirt to cause the flange to withdraw from the U-channel and disengage the protective skirt from the mounting frame. In an example embodiment, the method also includes installing a travel stop on the mounting frame, the travel stop configured to limit movement of the flange along the U-channel, when the flange is inserted in the U-channel. In some example embodiment, the method also includes installing a fiber distribution terminal at an end of the mounting frame. In an example embodiment, the method also includes routing a telecommunication line through a hole in the wall to the fiber distribution terminal, such that the telecommunication line is disposed in an internal volume defined by the protective skirt and mounting frame, when the protective skirt is engaged with the mounting frame. In some example embodiment, the method also includes coupling the telecommunication line to the mounting frame using one or more cable retention features.

In yet another example embodiment, a telecommunications assembly is provided including a fiber distribution terminal configured to enclose one or more optical communication connections. The fiber distribution terminal is affixed to a wall. The telecommunication assembly also includes a mounting frame configured to be affixed to the wall adjacent to the fiber distribution terminal and a protective skirt configured to be selectively engaged with the mounting frame to define an internal volume configured for routing of telecommunications cables. The mounting frame or the protective skirt includes a U-channel dispose at an edge and the other of the protective skirt and the mounting frame includes a flange configured to be received in the U-channel. The protective skirt is engaged with the mounting frame when the flange is inserted into the U-channel and the protective skirt is disengaged from the mounting frame by flexion of the protective skirt causing the flange to withdraw from the U-channel.

In still a further embodiment, a method of protecting telecommunications cables is provided including affixing a mounting frame to a wall and coupling a protective skirt to the mounting frame by flexing a portion of the protective skirt. The flexing allows the protective skirt to selectively engage the mounting frame and the selective engagement of the protective skirt is accomplished without tools or fasteners.

It is to be understood that the invention is not to be limited to the specific embodiments disclosed and that modifications and other embodiments are intended to be included within the scope of the appended claims. It is intended that the present invention cover the modifications and variations of this invention provided they come within the scope of the appended claims and their equivalents. Although specific terms are employed herein, they are used in a generic and descriptive sense only and not for purposes of limitation.

What is claimed is:

1. A protective apparatus for telecommunication cables comprising:
    a mounting frame configured to be affixed to a wall, the mounting frame comprising a lattice structure having a first member, a second member, and at least one transverse member extending between the first and second members; and
    a protective skirt configured to be selectively engaged with the mounting frame to define an internal volume configured for routing of the telecommunications cables, the protective skirt being moveable between a retained position and a released position through flexion of the protective skirt,
    wherein the mounting frame or the protective skirt comprises a U-channel disposed at an edge and the other of the protective skirt and the mounting frame comprises a flange configured to be received in the U-channel,
    wherein the protective skirt is engaged with the mounting frame when the protective skirt is in the retained position and the flange is received in the U-channel and the protective skirt is disengaged from the mounting frame when the protective skirt is in the released position and the flange is withdrawn from the U-channel; and
    wherein the at least one transverse member includes at least one cable retention feature configured to restrain the telecommunication cables in a position within the internal volume.

2. The protective apparatus of claim 1, wherein the U-channel comprises a first U-channel disposed at a first edge of the mounting frame and a second U-channel disposed at a second edge of the mounting frame.

3. The protective apparatus of claim 1, wherein the flange defines at least a portion of an outer edge of the protective skirt.

4. The protective apparatus of claim 1, wherein the mounting frame further comprises a travel stop configured to limit movement of the flange along the U-channel, when the flange is inserted in the U-channel.

5. The protective apparatus of claim 4, wherein the travel stop is disposed at an end of the mounting frame.

6. The protective apparatus of claim 1, wherein the protective skirt is configured to bias the flange toward the U-channel.

7. The protective apparatus of claim 1, wherein the mounting frame comprises at least one cable retention feature.

8. The protective apparatus of claim 1, wherein the protective skirt is open at least one end.

9. The protective apparatus of claim 1, wherein the protective skirt comprises a first opening at a first end and a second opening at a second end.

10. The protective apparatus of claim 1, wherein the mounting frame comprises a plurality of mounting features configured to affixed the mounting frame to the wall.

11. The protective apparatus of claim 1, wherein the protective skirt is toolessly removable from the mounting frame.

12. The protective apparatus of claim 1, wherein the U-channel comprises a first U-channel disposed at a first edge of the protective skirt and a second U-channel disposed at a second edge of the protective skirt.

13. The protective apparatus of claim 1, wherein the flange defines at least a portion of an outer edge of the mounting frame.

14. The protective apparatus of claim 1, wherein the protective skirt is U-shaped.

15. A method of protecting telecommunications cables comprising:
    affixing a mounting frame to a wall, wherein the mounting frame comprises a lattice structure having a first member, a second member, and at least one transverse member extending between the first and second members, wherein the at least one transverse member that includes at least one cable retention feature configured to restrain the telecommunication cables;
    providing a protective skirt, wherein the protective skirt is moveable between a retained position and a released position through flexion of the protective skirt, and wherein the mounting frame or the protective skirt comprises a U-channel disposed at an edge and the other of the protective skirt and the mounting frame comprises a flange configured to be received in the U-channel;
    flexing the protective skirt to the released position to enable the flange to align with the U-channel; and
    releasing the flexion to move the protective skirt toward the retained position such that the flange is received in the U-channel thereby engaging the protective skirt with the mounting frame.

16. The method of claim 15 further comprising:
    flexing the protective skirt to cause the flange to withdraw from the U-channel and disengage the protective skirt from the mounting frame.

17. The method of claim 15 further comprising:
    installing a travel stop on the mounting frame, the travel stop configured to limit movement of the flange along the U-channel, when the flange is inserted in the U-channel.

18. The method of claim 15 further comprising:
    installing a fiber distribution terminal at an end of the mounting frame.

19. The method of claim 18 further comprising:
    routing a telecommunication line through a hole in the wall to the fiber distribution terminal, such that the telecommunication line is disposed in an internal volume defined by the protective skirt and the mounting frame, when the protective skirt is engaged with the mounting frame.

20. The method of claim 19 further comprising:
    coupling the telecommunication line to the mounting frame using one or more cable retention features.

21. A telecommunications assembly comprising:
    a fiber distribution terminal configured to enclose one or more optical communication connections, wherein the fiber distribution terminal is affixed to a wall;
    a mounting frame configured to be affixed to the wall adjacent to the fiber distribution terminal; and a protective skirt configured to be selectively engaged with the mounting frame to define an internal volume configured for routing of telecommunications cables, the protective skirt being moveable between a retained position and a released position through flexion of the protective skirt, wherein the mounting frame or the protective skirt comprises a U-channel disposed at an edge and the other of the protective skirt and the mounting frame comprises a flange configured to be received in the U-channel, wherein the protective skirt is engaged with the mounting frame when the protective skirt is in the retained position and the flange is received in the U-channel and the protective skirt is disengaged from the mounting frame when the protective skirt is in the released position and the flange is withdrawn from the U-channel.

22. A method of protecting telecommunications cables comprising:

affixing a mounting frame to a wall, wherein the mounting frame comprises a lattice structure having a first member, a second member, and at least one transverse member extending between the first and second members, and wherein the at least one transverse member includes at least one cable retention feature configured to restrain the telecommunication cables in a position within the internal volume; and coupling a protective skirt to the mounting frame by flexing a portion of the protective skirt, wherein the flexing allows the protective skirt to selectively engage the mounting frame and wherein the selective engagement of the protective skirt is accomplished without tools or fasteners.

* * * * *

UNITED STATES PATENT AND TRADEMARK OFFICE
CERTIFICATE OF CORRECTION

PATENT NO. : 11,812,574 B2
APPLICATION NO. : 17/351339
DATED : November 7, 2023
INVENTOR(S) : Nathan Grant Castleberry et al.

It is certified that error appears in the above-identified patent and that said Letters Patent is hereby corrected as shown below:

In the Claims

In Column 10, Line 22, in Claim 15, after "member" delete "that".

Signed and Sealed this
Ninth Day of April, 2024

Katherine Kelly Vidal
Director of the United States Patent and Trademark Office